United States Patent
Colonna et al.

(10) Patent No.: US 6,753,799 B2
(45) Date of Patent: Jun. 22, 2004

(54) RANDOMIZER FOR SIGMA-DELTA-TYPE CONVERTER

(75) Inventors: Vittorio Colonna, Landriano (IT); Andrea Baschirotto, Tortona (IT); Gabriele Gandolfi, Siziano (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/384,493

(22) Filed: Mar. 6, 2003

(65) Prior Publication Data

US 2003/0189504 A1 Oct. 9, 2003

(30) Foreign Application Priority Data

Mar. 6, 2002 (IT) ...................................... MI2002A0459

(51) Int. Cl.[7] .............................................. H03M 3/00
(52) U.S. Cl. ...................................... 341/143; 341/155
(58) Field of Search ................................ 341/143, 131, 341/118

(56) References Cited

U.S. PATENT DOCUMENTS 5,191,331 A * 3/1993 Karema et al. ............. 341/131

* cited by examiner

*Primary Examiner*—Brian Young
(74) *Attorney, Agent, or Firm*—Lisa K. Jorgenson; Bryan A. Santarelli; Graybeal Jackson Haley LLP

(57) ABSTRACT

A sigma-delta-type converter comprises: a sigma-delta modulator having a digital output having a first prefixed bit number; a randomizer including a circular memory; an analogical reconstruction filter comprising a branch number equal to said first default number including sampling capacitors and a low-pass filter; characterized in that said circular memory comprises a number of elements equal to said first default number of bits less one and receives in input said first default number of bits less one, and in that a bit of said first default number of bits is applied to one of said branches of said reconstruction filter.

22 Claims, 3 Drawing Sheets

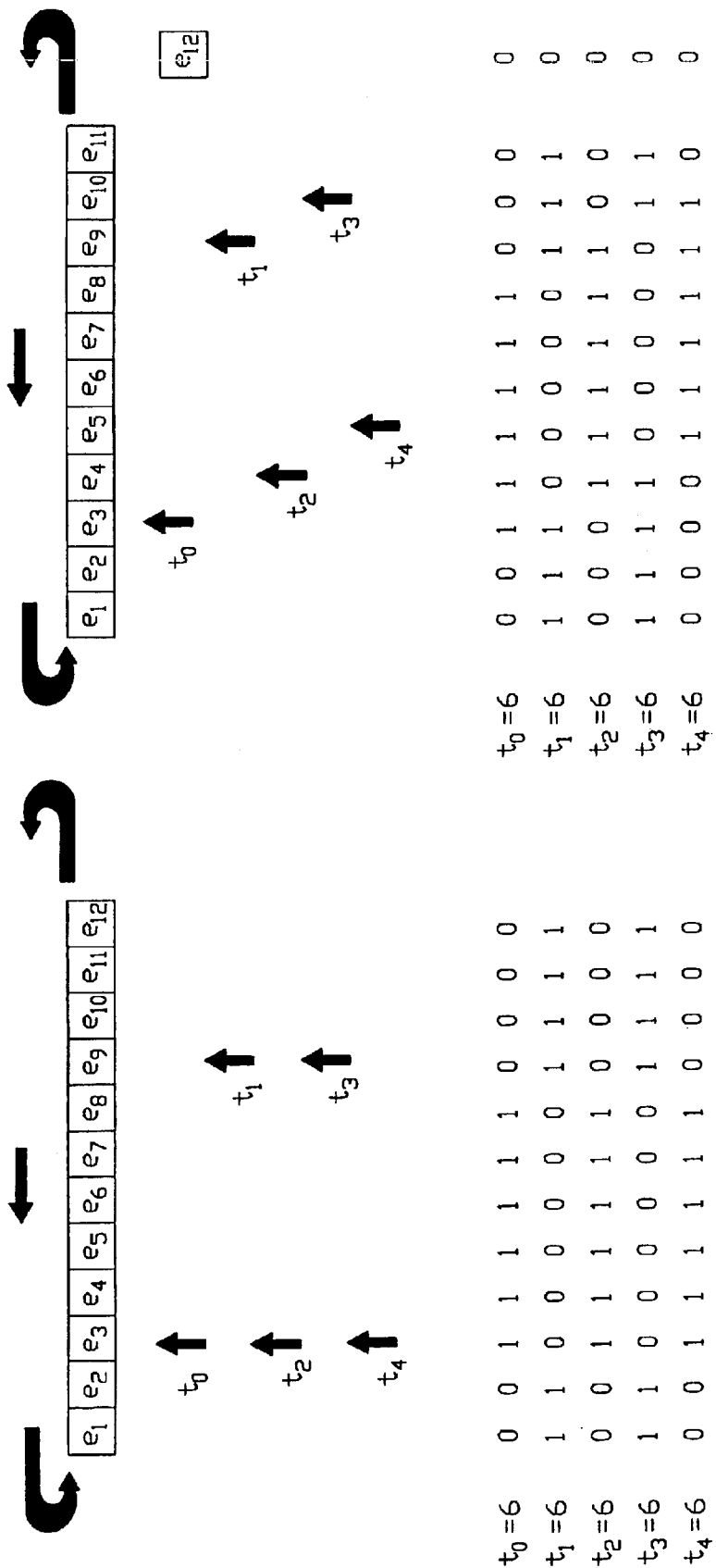

US 6,753,799 B2

RANDOMIZER FOR SIGMA-DELTA-TYPE CONVERTER

This application claims priority from Italian patent application No. MI2002A000459, filed Mar. 6, 2002, which is incorporated herein by reference.

TECHNICAL FIELD

The present invention refers to an analog-to-digital (ADC) or digital-to-analog (DAC) sigma-delta-type converter and to a method to carry out a sigma-delta-type conversion; it refers particularly to a randomizer for a sigma-delta-type converter.

BACKGROUND

In the last few years, high-resolution digital-to-analog sigma-delta-type ($\Sigma\Delta$) converters (DAC) have become very popular in audio applications. In particular, in order to reduce the silicon area and power consumption, multi-bit lower-order modulators are largely used. But they have however the drawback to have to use a random-number generating structure (randomizer) to interface the quantizer output levels with the following reconstruction filter. In fact, the reconstruction filter if realized with switching capacitors requires sampling capacitors whose values are subject to errors related to the technological process used to manufacture the converter, and these errors heavily influence the converter performance. However, the cumulative error, due to the presence of the capacitors, becomes equal to zero when all the capacitors have been selected for the same number of times.

Different types of randomizers are known, such as, for example, that described in the article by Rex T. Baird and Terri S. Fiez, "Linearity Enhancement of Multibit DS A/D and D/A Converters Using Weighted Averaging", IEEE Trans. On Circuits and Systems, vol.42, No. 12, December 1995. This article is one of the best from the point of view of the simplicity of the circuit realization, because only one circular memory supplied by the digital output of the modulator is enough to determine which capacitors will be used at every synchronization cycle.

One of the most important limitations of this kind of structure is the fact that it does not have a good performance if applied to structures requiring an odd number of quantization levels. On the other hand (see I. Fujimori, T. Sugimoto, "A 1.5 V, 4.1 mW Dual-Channel Audio Delta-Sigma D/A Converter", IEEE Journal Of Solid-state Circuits, vol. 33, No. 12, December 1998) it is important to use an odd number of levels of the quantizer to avoid the free tones produced by the low-order modulators.

Another problem is the fact that, when a signal is applied to the modulator having a low dynamic, the circular memory saturates easily.

In fact, for example in the case of a circular memory with 12 elements and with a low-level input signal, a logical word having 6 consecutive identical logic levels will frequently be used. In the presence of a high number of 6 consecutive values, the action of the randomizer will not be efficient because every two synchronization cycles the same capacitors of the reconstruction filter will be selected, nullifying the presence of the randomizer. In such a situation, tones at a frequency equal to half the synchronization frequency will be produced that will disturb the signal to be converted.

For this reason, a second-order randomizer is often used. But as is known, this often increases the complexity of the circuitry, the area occupied by the circuitry, and the power dissipated by the circuitry.

SUMMARY

In view of the state of the art described, an embodiment of the present invention provides a sigma-delta converter that does not have the drawbacks of the known art.

According to this embodiment, the sigma-delta-type converter comprises: a sigma-delta modulator having a digital output having a first prefixed number of bits; a randomizer including a circular memory; an analogic reconstruction filter comprising a branch number equal to said first prefixed number and including sampling capacitors and a low-pass filter; characterized in that said circular memory comprises a number of elements equal to said first prefixed number of bits less one and receives at an input said first prefixed number of bits less one, and in that a bit of said first prefixed number of bits is applied to one of said branches of said reconstruction filter.

According to another embodiment of the invention, a method for carrying out a sigma-delta-type conversion comprises the steps of providing at the output of a multi-bit sigma-delta modulator a prefixed number of bits; applying at a randomizer a number of bits equal to said prefixed number of bits less one; applying the outputs of said randomizer to corresponding inputs of a converter with capacitors; applying a bit provided by said sigma-delta modulator to an input of said converter with capacitors.

Thanks to these embodiments, it is possible to avoid the saturation of the circular memory, to obtain a reduction of the quantization noise, and to avoid the generation of free tones. It is possible to use a sigma-delta modulator of low order and/or at a low frequency of operation. Furthermore, a reduction of the circuit area and a reduction of the dissipated power are obtained.

BRIEF DESCRIPTION OF THE DRAWINGS

The features and the advantages of the present invention will be made more evident by the following detailed description of a particular embodiment, illustrated as a non-limiting example in the annexed drawings, wherein:

FIG. 3a shows a repetitive sequence of values in the case of a circular memory with 12 elements according to the prior art;

FIG. 3b shows a repetitive sequence of values in the case of a circular memory with 11 elements according to an embodiment of the present invention;

DESCRIPTION OF THE INVENTION

Figure 1:
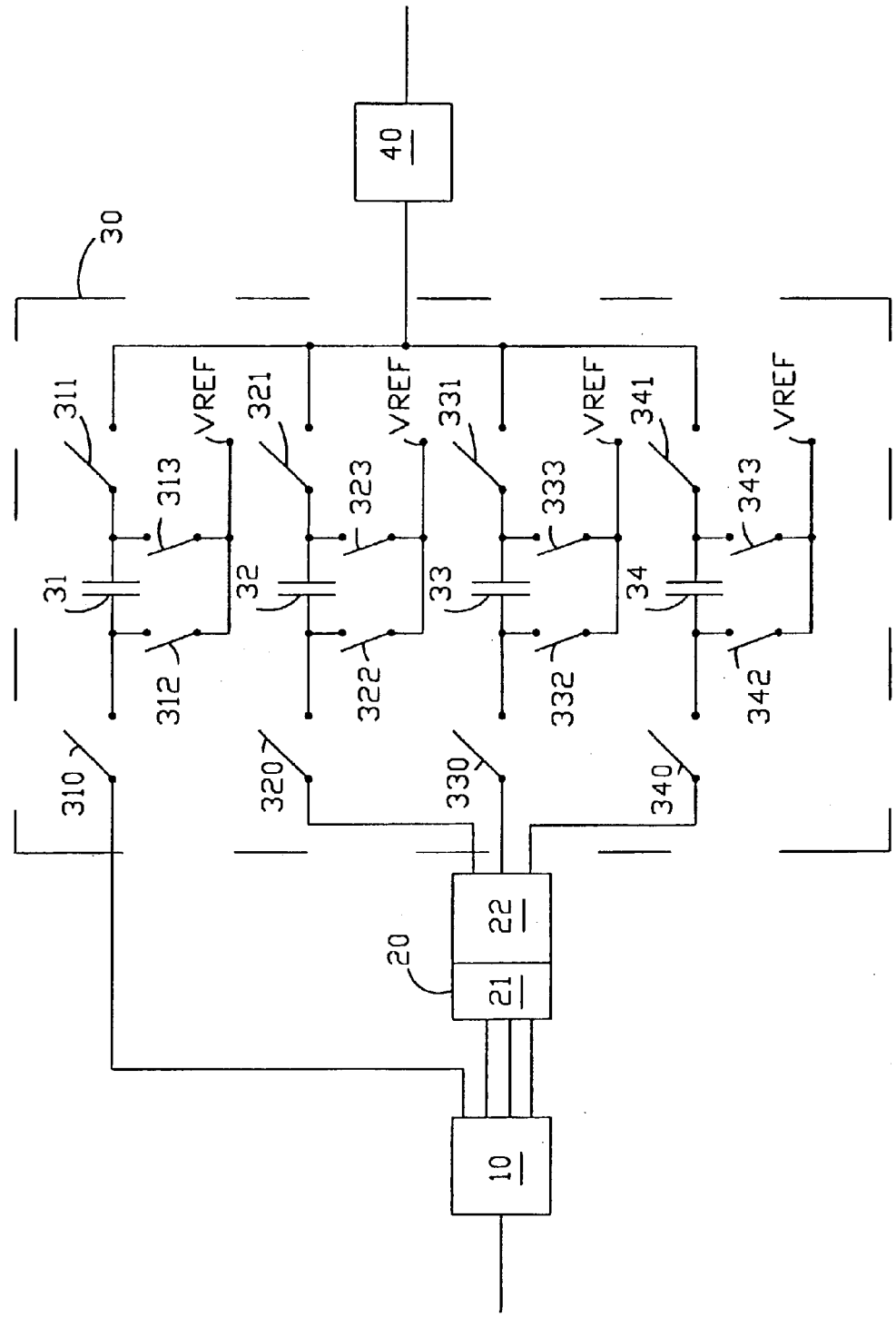
FIG. 1 is a schematic diagram of a sigma-delta-type digital-to-analog converter according to an embodiment of the present invention.

Referring now to FIG. 1, which is a schematic diagram of a sigma-delta-type ADC that includes a DAC that, for representative simplicity, has 5 analog output levels. A sigma-delta modulator 10 receives an analog signal, and it produces at its output a digital signal having preferably 2n bits (even) for 2n+1 analog-output levels (odd), where n in this case is equal to 2. The sigma-delta modulator 10 is followed by a structure for generating random numbers (randomizer) 20 that includes a circular memory 21 having 2n−1 elements and by an output selector 22. The structure 20 receives 2n−1 bits from the sigma-delta modulator 10 and it provides 2n −1 outputs.

The 2n−1 outputs of the sigma-delta modulator 10 are applied to respective inputs of a reconstruction filter having 2n branches 30 including sampling capacitors (defined also switched capacitors) 31–34 followed by a low-pass filter 40.

The 2n branches 30 including the sampling capacitors 31–34 have 2n inputs respectively connected to a terminal of the switches 310, 320, 330 and 340. The other terminal of the switches 310, 320, 330 and 340 is connected to a terminal of the capacitors 31–34 and to a terminal of the switches 312, 322, 332 and 342. The other terminal of the capacitors 31–34 is connected to a terminal of the switches 311, 321, 331, 341, 313, 323, 333 and 343. The other terminal of the switches 312, 322, 332, 342, 313, 323, 333 and 343 is connected to a reference voltage Vref.

The switches 310, 320, 330, 340, 313, 323, 333 and 343 are controlled by a synchronism signal, and the switches 311, 321, 331, 341, 312, 322, 332 and 342 are controlled by the complement of the synchronism signal.

Of the 2n branches 30, 2n−1 branches (those that contain the capacitors 32–34) are connected to the output of the randomizer 20 while a remaining branch (which contains the capacitor 31) is connected directly to the sigma-delta modulator 10.

The branches 30 can be also considered as the elements to realize the DAC with capacitors.

seen that with n=6, that is with 12 elements of the circular memory, with a repetitive sequence of 6 values, the action of the randomizer will not be efficient because every two synchronization cycles the same input of the reconstruction filter will be selected, frustrating the presence of the randomizer. In this case, instead of FIG. 3b, according to an embodiment of the present invention, with n=6, and with 11 elements of the circular memory 21, it occurs that with a repetitive sequence of 6 values, the choice of the inputs of the branches 30 is variable.

In this embodiment, the choice of the bit that is not random (here, the bit coupled to the switch 310 is FIG. 1) has been optimized for the purpose of determining the linearity losses. In fact, if only 11 random elements of 12 are considered, an angle in the straight line can appear that represents the characteristic of linearity. Particularly the most significant bit (MSB) has been selected because, referring to a statistic analysis of a signal of 22 kHz, at the limit of the audio band, it occurred 42 times out of a total of 65536. This means that for this kind of application the linearity loss is very low and the distortion problems are not meaningful, further considering that at high dynamic levels the reconstruction filter gives the greatest distortion contribution.

According to an embodiment of the present invention, a converter is realized and it has been compared, as regards the signal to noise ratio (SNR), with one without a randomizer and with one with a randomizer according to the known art, and the results are shown in Table 1. The input signal was an audio signal with an audio band of 22 kHz.

TABLE 1

| Amplitude of the input signal (dB) | SNR without randomizer (dB) Minimum value-typical value | SNR with a randomizer of the known art (dB) Minimum value-typical value | SNR with randomizer according to the present invention (dB) Minimum value-typical value |
|---|---|---|---|
| 0—1 | 55–65 | 105–107 | 96–107 |
| −1—25 | 56–65 | 105–108 | 106–108 |
| −25—35 | 75–85 | 98–104 | 107–110 |
| −35—50 | 75–84 | 90–98 | 106–109 |
| −50—65 | 75–84 | 100–104 | 106–109 |
| −65→ | 75–85 | 106–109 | 105–109 |

Figure 2:
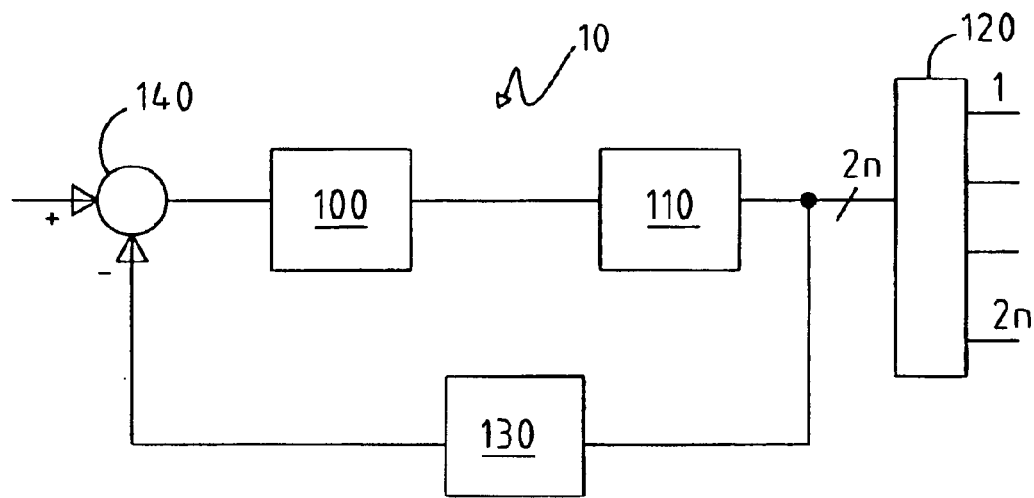
FIG. 2 is a schematic diagram of a sigma-delta modulator according to an embodiment of the invention.

FIG. 2 shows a schematic diagram of the sigma-delta modulator 10 of FIG. 1 according to an embodiment of the invention. It is constituted by an integrator 100 connected to a quantizer 110 that provides at its output 2n bits connected to a circuit 120 able to produce a parallel output having a thermometric coding of the signal at its input. The 2n bits at the output of the quantizer 110 are also connected to a conversion circuit 130, whose output signal is algebraically added with the input signal by the adder node 140 (note that the output of the circuit 130 is coupled to an inverting input of the node 140). The output of the adder node 140 is applied to the input of the integrator 100.

Figure 4:
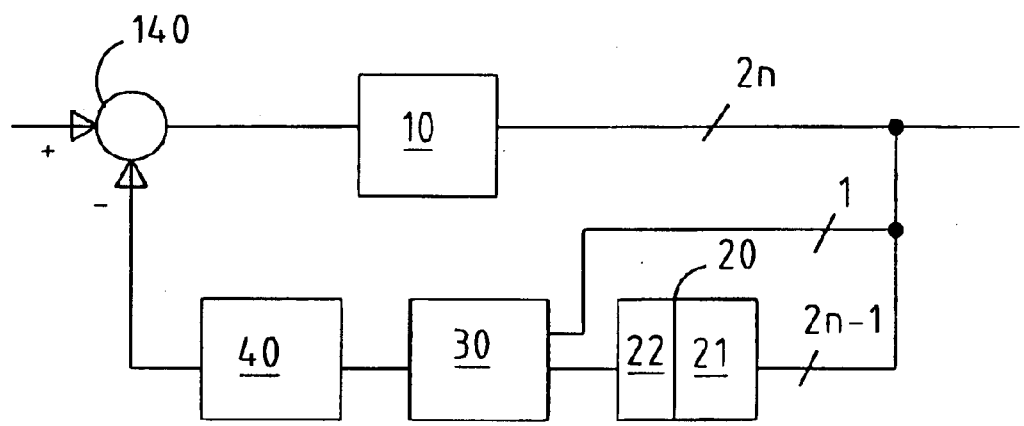
FIG. 4 is a schematic diagram of a sigma-delta-type analog-to-digital converter according to an embodiment of the present invention.

A basic goal of this embodiment of the present invention is not to effect the random choice of an input of the reconstruction filter 30, 40. Particularly, directly connecting the most significant bit (MSB) in the thermometric coding to a branch 30 results in asymmetrical randomness. In fact, in FIG. 3a, where with e1–e12 the elements of the circular memory and consequently the inputs of the reconstruction filter are represented, in the case of the known art it can be FIG. 4 shows a schematic diagram of a sigma-delta-type ADC converter according to an embodiment of the present invention. It includes a sigma-delta modulator 10 that receives an analog signal and provides a digital signal. The sigma-delta modulator 10 is connected to a generating structure of random numbers (randomizer) 20, that comprises a circular memory 21 and a selector 22 of the outputs. The randomizer 20 receives 2n−1 bits from the sigma-delta modulator 10 and it provides 2n−1 outputs.

The 2n−1 outputs of the sigma-delta modulator 10 are applied to the respective inputs of a reconstruction filter 30, 40 composed by 2n branches 30 including sampling capacitors 31–34 followed by a low-pass filter 40 (see FIG. 1). The adder node 140 adds the output signal of the filter 40 to the input signal (note that the output signal of the filter 40 is coupled to an inverting terminal of the adder node 140). The output of the adder node 140 is applied to the input of the sigma-delta modulator 10.

The various blocks of FIGS. 1, 2, and 4 have not been described in detail because they are conventional.

The sigma-delta-type converter to which the randomizer 20 is applied can be both of the switched-capacitor type or of the switched-current-generator type. However the above-described solution can be applied whenever some elements subject to variation in the values due to the technological process have to be chosen in a random way.

From the foregoing, it will be appreciated that, although specific embodiments of the invention have been described herein for purposes of illustration, various modifications may be made without deviating from the spirit and scope of the invention.

What is claimed is:

1. Sigma-delta-type converter comprising: a sigma-delta modulator having a digital output having a first prefixed bit number; a randomizer including a circular memory; an analogical reconstruction filter comprising a branch number equal to said first default number including sampling capacitors and a low pass filter; characterized in that said circular memory comprises a number of elements equal to said first default number of bits less one and receives in input said first default number of bits less one, and in that a bit of said first default number of bits is applied to one of said branches of said reconstruction filter.

2. Converter according to claim 1 characterized in that said sigma delta type converter is digital-analogical.

3. Converter according to claim 1 characterized in that said sigma delta type converter is analogical-digital.

4. Converter according to claim 1 characterized in that said digital output is encoded through a thermometric code.

5. Converter according to claim 1 characterized in that said first prefixed bit number is an even number.

6. Converter according to claim 1 characterized in that said randomizer determines in a random way the connections between it and said reconstruction filter.

7. Method for carrying out a sigma delta type conversion comprising the phases of providing at the output of a multi bit sigma delta modulator a default number of bits; applying at a randomizer a number of bits equal to said default number of bits less one; applying the outputs of said randomizer to corresponding inputs of an analogical-digital converter; applying a bit provided by said sigma delta modulator to an input of said analogical-digital converter with capacitors.

8. Method according to claim 7 characterized in that said sigma delta type converter is digital to analogical.

9. Method according to claim 7 characterized in that said sigma delta type converter is analogical to digital.

10. Method according to claim 7 characterized in that said analogical to digital converter is with switched capacitors.

11. Method according to claim 7 characterized in that said analogical to digital converter is with switched current generator.

12. A sigma-delta analog-to-digital converter, comprising:
a modulator operable to receive an input analog signal and to generate a first number of data bits in response to the signal;
a circular memory coupled to the modulator and operable to store a second number of the data bits generated by the modulator, the second number less than the first number; and
a reconstruction filter operable to receive the second number of bits from the circular memory, to receive the remaining of the first number of bits from the modulator, and to generate an output analog signal in response to the received bits.

13. The sigma-delta analog-to-digital converter of claim 12, further comprising a filter coupled to the reconstruction signal and operable to filter the output analog signal.

14. The sigma-delta analog-to-digital converter of claim 12 wherein the second number is one less than the first number.

15. The sigma-delta analog-to-digital converter of claim 12 wherein the a reconstruction filter comprises:
a first set of branches each operable to receive a respective one of the first number of data bits from the modulator and including a respective capacitor; and
a second set of branches each operable to receive a respective one of the second number of data bits from the circular memory and including a respective capacitor.

16. A circuit, comprising:
a circular memory operable to receive and store a first number of data bits; and
a reconstruction filter operable to receive the first number of data bits from the circular memory, to receive a second number of data bits, and to generate an analog signal in response to the first and second numbers of data bits.

17. The circuit of claim 16 wherein the second number of data bits equals one data bit.

18. The circuit of claim 16 wherein:
the first and second numbers of data bits form a data value; and
the second number of data bits form the most significant bits of the data value.

19. A method, comprising:
randomly ordering a first set of bits; and
converting a digital value into an analog signal, the digital value including the randomly ordered first set of bits and a second set of bits.

20. The method of claim 19 wherein the second set of bits includes a single bit.

21. The method of claim 19 wherein the first set of bits includes three bits.

22. The method of claim 19, further comprising generating the first and second sets of data bits with a sigma-delta modulator.

* * * * *